(12) United States Patent
Ubbesen et al.

(10) Patent No.: US 8,437,714 B1
(45) Date of Patent: May 7, 2013

(54) ADVANCED LOAD-SWITCH CIRCUIT WITH ZERO PHASE ROTATION

(75) Inventors: Lars Sandahl Ubbesen, Aalborg (DK); Michael Nielsen, Vodskov (DK)

(73) Assignee: RF Micro Devices, Inc., Greensboro, NC (US)

( * ) Notice: Subject to any disclaimer, the term of this patent is extended or adjusted under 35 U.S.C. 154(b) by 376 days.

(21) Appl. No.: 12/835,793

(22) Filed: Jul. 14, 2010

Related U.S. Application Data

(60) Provisional application No. 61/301,789, filed on Feb. 5, 2010, provisional application No. 61/243,387, filed on Sep. 17, 2009, provisional application No. 61/225,441, filed on Jul. 14, 2009.

(51) Int. Cl.
*H03C 1/52* (2006.01)

(52) U.S. Cl.
USPC ............... 455/107; 455/120; 455/77

(58) Field of Classification Search .......... 455/91, 455/95, 107, 114.1, 114.2, 117, 120, 121, 455/127.5, 129, 77, 82, 83, 84
See application file for complete search history.

(56) References Cited

U.S. PATENT DOCUMENTS

2009/0174496 A1* 7/2009 Van Bezooijen ............ 333/17.3
2010/0056089 A1* 3/2010 Tadayon .................... 455/196.1

OTHER PUBLICATIONS

De Graauw, A.J.M. et al., "MEMS-Based Reconfigurable Multi-band BiCMOS Power Amplifier," 2006 Bipolar/ BiCMOS Circuits and Technology Meeting, Oct. 8-10, 2006, pp. 1-4, IEEE.
Jeong, Hyeong Tae et al., "Efficiency enhancement method for high-power amplifiers using a dynamic load adaptation technique," 2005 IEEE MTT-S International Microwave Symposium Digest, Jun. 12-17, 2005, pp. 2059-2062, IEEE.
Larcher, L. et al., "A MEMS reconfigurable quad-band Class-E Power Amplifier for GSM standard," 2009 Design, Automation & Test in Europe Conference & Exhibition, Apr. 20-24, 2009, pp. 364-368, IEEE.
Zhang, Chunna et al., "A novel reconfigurable power amplifier structure for multi-band and multi-mode portable wireless applications using a reconfigurable die and a switchable output matching network," 2009 IEEE MTT-S International Microwave Symposium Digest, Jun. 7-12, 2009, pp. 913-916, IEEE.
"Battery Life Testing Application Notes—rev. 1.1," Racal 6103 Digital Radio Test Set Product Information Sheet, copyright 1998, pp. 1-4, Racal Instruments Limited.

* cited by examiner

*Primary Examiner* — Ping Hsieh
(74) *Attorney, Agent, or Firm* — Withrow & Terranova, P.L.L.C.

(57) ABSTRACT

The present disclosure relates to the efficient transmission of voice and data signals using mobile terminals, and in particular to optimizing the power added efficiency (PAE) of a power amplifier (PA) by controlling the amplifier's load impedance over a range of radio frequency (RF) output power levels. A power amplifier having a first power level and at least a second power level is provided along with a first impedance matching network section with an output. A second impedance matching network section and at least a third impedance network section in communication with the output are selectably coupled to a load network by switches that are opened and close in response to various power levels of operation for the load switch circuit.

23 Claims, 13 Drawing Sheets

| POWER LEVEL NUMBER | POWER OUTPUT LEVEL dBm |
|---|---|
| 2 | 39 |
| 3 | 37 |
| 4 | 35 |
| 5 | 33 |
| 6 | 31 |
| 7 | 29 |
| 8 | 27 |
| 9 | 25 |
| 10 | 23 |
| 11 | 21 |
| 12 | 19 |
| 13 | 17 |
| 14 | 15 |
| 15 | 13 |
| 16 | 11 |
| 17 | 9 |
| 18 | 7 |
| 19 | 5 |

ADVANCED LOAD-SWITCH CIRCUIT WITH ZERO PHASE ROTATION

RELATED APPLICATIONS

This application claims the benefit of provisional patent application Ser. No. 61/225,441, filed Jul. 14, 2009, provisional patent application Ser. No. 61/243,387, filed Sep. 17, 2009, and provisional patent application Ser. No. 61/301,789, filed Feb. 5, 2010, the disclosures of which are hereby incorporated herein by reference in their entireties.

FIELD OF THE DISCLOSURE

The present disclosure relates to the efficient transmission of voice and data signals using mobile terminals, and in particular to optimizing the power added efficiency (PAE) of a power amplifier (PA) by controlling the PA's load impedance over a range of radio frequency (RF) output power levels.

BACKGROUND OF THE DISCLOSURE

The European Information and Communications Industry Association (EICTA), which was rebranded DIGITALEUROPE in March of 2009 was formed from a consolidation of the European Telecommunications and Professional Electronics Industry (ECTEL) and the European Association of Manufacturers of Business Machines and Information Technology (EUROBIT). This disclosure refers to standards enacted by ECTEL. The ECTEL standards include talk time and standby time for Global System for Mobile Communications (GSM) mobile terminals. GSM mobile terminals operating in the 900 MHz band have defined power levels. FIG. 1 is a table showing GSM power level (PWL) numbers with corresponding power output levels delivered to a GSM mobile terminal's antenna.

ECTEL talk time is measured at power level 7 (PWL 7) which is defined as 29 dBm of output power delivered to a mobile terminal's antenna. However, due to a typical antenna trace loss of 0.3 dBm, the output power of a PA is preferably increased to 29.3 dBm. In another example, a GSM mobile terminal operating in the extended E-GSM-900 band that spans 880-915 MHz within the European Union (EU) includes a low band (LB) power amplifier (PA) that needs to provide at least 32.5 dBm of output power at the mobile terminal's antenna. However, the PA is typically designed for 34.2 dBm because of an antenna trace loss and a preferred production margin. Power losses such as the antenna trace loss affect a figure of merit for PAs known as power added efficiency (PAE). A relatively low PAE reduces talk time for a mobile terminal.

As such, a goal of an optimal PAE for typical power levels should be focused on PA output circuitry design.

The relationship between power added efficiency (PAE), output power ($P_o$) and maximum output power ($P_{MAX}$) can roughly be calculated as:

$$PAE(P_o) = PAE_{P_{MAX}} \cdot \sqrt{\frac{P_o}{P_{MAX}}}.$$

FIG. 2 illustrates the relationship between PAE and $P_o$. Typically, a PA design specification requires the PA to be able to deliver $P_{MAX}$. Yet, the PA is most often operated at a lower power than $P_{MAX}$. As a result, PAE is reduced to undesirable percentages when the PA is operated at lower levels such as PWL 7, 8, etc.

As shown in FIG. 2, a PA achieving 45% PAE when operated at 34 dBm will only achieve a PAE of around 26% when the PA is operated at 29 dBm.

FIG. 3 is a schematic diagram of a prior art mobile terminal output stage 10 that includes a PA 12 with a load switch 14 for switching in and out impedance elements of an impedance matching network 16 that is coupled to PA 12. The impedance matching network 16 is selectively in communication with an antenna 18 through a transmit and receive (T/R) switch 20 and a filter 22. The prior art load switch and impedance matching network of FIG. 3 is commonly used to improve PAE when the PA 12 is operated at lower power levels than $P_{MAX}$. A goal of the load switch concept illustrated in FIG. 3 is to design an output impedance matching network that includes two impedance matching states. A first impedance matching state is for PWL 5 and PWL 6, in which the PA 12 may provide a maximum power of 34.2 dBm. A second impedance matching state is for PWL 7 as well as lower power levels and provides a lower output power, but yields an improved PAE.

FIG. 4 depicts the improvement in PAE by activation of the load switch 14. When the load switch 14 is deactivated, the PA 12 may deliver power at the PWL 5 and PWL 6 power levels through the impedance matching network 16 at the first impedance matching state. Conversely, when the load switch 16 is activated, the PA 12 may deliver power at the PWL 7 power level and below through the impedance matching network 16 at the second impedance matching state. As shown in FIG. 4, activating the load switch 14 improves the PAE of the PA 12 from about 26% to about 40% for PWL 7. Consequently, the talk time of a mobile terminal incorporating the load switch 14 and impedance matching network 16 is significantly increased for PWL 7 and below.

A traditional design of a load switch circuit comes from classical power amplifier textbook theory, which is briefly described below. FIG. 5 is a schematic diagram of a typical load switch circuit having PA with a transistor 24 and output impedance matching network 26 that was designed in accordance with the classical power amplifier textbook theory. The task of designing the output impedance matching network 26 is primarily to convert an antenna impedance ($Z_{ant}$) to a lower impedance level at the collector of the transistor 24. The lower impedance level ($R_{Opt}$) is generally given as:

$$R_{Opt} = \frac{(V_{cc} - V_{knee})^2}{2 \cdot Po},$$

where $P_o$ is the maximum output power in Watts plus the impedance matching loss, $V_{cc}$ is the battery supply voltage and $V_{knee}$ is a transistor parameter for the transistor 24. Note that the values calculated from the above equation may need to be adjusted for a practical PA, because the above equation assumes a pure sinusoidal collector voltage, which is usually an incorrect assumption for modern PA circuitry. Nevertheless, the equation serves the purpose of showing that the optimum load impedance as seen from the collector is dependent upon the desired output power. Generally, a lower collector load impedance is required for a given higher output power. As such, the design of a load switch circuit may be redefined as designing an impedance matching network that will present a collector of a PA output transistor with a relatively low impedance of around two and one-half Ohms for PWL 5, and a relatively higher impedance of around seven Ohms to seven and one-half Ohms for PWL 7.

The PAE of a PA typically depends on three criteria.

The impedance presented to the collector of the PA's output transistor. This impedance needs to be designed such that the PA can provide a desired output power, but no more than the desired output power.

The minimization of energy losses due to the output impedance matching network.

The harmonic termination seen from the collector of the PA's output transistor, which is to a large degree associated with the class of the PA (i.e., class AB, F, E, and so on).

A well designed load switch circuit with an output impedance matching network ensures that all three criteria are met. Unfortunately, designing a load switch circuit with an output impedance matching network needed to provide a desired output power, but no more than the desired output power while minimizing energy losses due to the output impedance matching network is a particularly difficult challenge.

In FIG. 6A, a series of load-pull contours depicting power consumption for a typical PA is shown overlaying a Smith Chart. Notice that the load-pull contours depicting power consumption are more or less centered around fifty Ohms, which is at the center of the Smith Chart.

FIG. 6B provides an example in which a PA's output current is significantly lower in the upper right quadrant of a series of PA output current contours shown overlaying a Smith chart. A load impedance, which in this case is an antenna impedance, is represented by a load impedance arrow that extends from the center of the Smith Chart. The mobile terminal circuit board designer will attempt to rotate the load impedance arrow to an angle that yields minimum PA current draw. The angle of minimum PA current draw is referred to as a sweetspot in RF engineering vernacular. For the purpose of this disclosure, the sweetspot of an impedance match is the load impedance such as an antenna impedance ($Z_{ant}$) that is presented to the PA for a given VSWR such that the electrical current draw of the PA is minimized. The location of the sweetspot primarily depends upon an output impedance matching network in communication with the PA.

Typically, an antenna designer is not able to design an antenna for a mobile terminal with fifty Ohms of impedance. Instead, the antenna impedance is typically located within a 3:1 Voltage Standing Wave Ratio (VSWR) circle. A mobile terminal circuit board designer typically attempts to rotate the load impedance arrow for the best compromise between power and current consumption for the PA.

The design practice of rotating the load impedance arrow to an angle that yields minimum PA current draw plays a significant, but often overlooked role in the load switch circuit. For the load switch circuit to provide an increase in PAE, the sweetspots of PWL 5 and PWL 7 matches are preferably located relatively close to each other. FIGS. 7A and 7B illustrate a problem of not having properly aligned sweetspots. Rotating the load impedance arrow for PWL 5 to the upper left quadrant of a series of PA output current contours shown overlaying a Smith chart in FIG. 7A results in a poor antenna impedance rotation for PWL 7 having a series of PA output current contours shown overlaying a Smith chart in FIG. 7B. Consequently, the benefit of the load switch is jeopardized.

The requirements for the load switch circuit can be summarized as follows.

The output impedance matching network must be able to present optimized antenna impedance to the PA's collector for both power levels PWL 5 and PWL 7.

The energy loss due to the output impedance matching network must be low for both power levels whether the output impedance matching network is designed for a fifty Ohm antenna load or other antenna impedances located within a VSWR circle. Therefore, it is preferred that the load impedance arrow representing antenna impedance be rotated to the sweetspot for electrical current contours on the Smith Chart.

The harmonics must be properly terminated in power levels PWL 5 and PWL 7.

The sweetspot must be aligned such that the load impedance arrow may be rotated into the region where the PA has minimum current draw in power levels PWL 5 and PWL 7.

FIG. 8 is a schematic diagram of a typical PA having a transistor 28 and output impedance matching network 30 that was designed in accordance with the classical power amplifier textbook theory. The traditional approach of implementing a load switch is to switch in an extra capacitor in the matching network either at C1, C2, or C3 by way of switches S3, S4 and S5, respectively. In general, it is most cost efficient to implement just one of the switches S3, S4 and S5. Other implementations of load switch circuits have been proposed in the prior art. Some examples include: "Efficiency Enhancement Method for High-Power Amplifiers using a Dynamic Load Adaptation Technique," by H. T. Jeong et al., Microwave Symposium Digest, 2005 IEEE MTT-S International, pp 2059-2062; "A MEMS Reconfigurable Quad-Band Class-E Power Amplifier for GSM Standard," by L. Larcher et al., Proceedings of the 22nd IEEE International Conference on Micro Electro Mechanical Systems MEMS 2009, Sorrento, Italy, 25-29 Jan. 2009, pp 864-867; "A Novel Reconfigurable Power Amplifier Structure for Multi-Band and Multi-Mode Portable Wireless Applications using a Reconfigurable Die and a Switchable Output Matching Network," by C. Zhang and A. E. Fathy, Microwave Symposium Digest, 2009. MTT '09. IEEE MTT-S International, pp 913-916; and "MEMS-Based Reconfigurable Multi-band BiCMOS Power Amplifier," by A. J. M. de Graauw et al., Bipolar/BiCMOS Circuits and Technology Meeting, 2006, pp 1-4, the disclosures of which are incorporated herein by reference in their entireties.

The traditional approach of designing load switch circuits has two primary deficiencies:

The component that is switched into the output matching network exhibits a poor quality factor (Q-factor) because of the loss coming from the switch. A poor Q-factor may be avoided by using Micro-electromechanical Systems (MEMS) devices. However, MEMS devices are expensive and often require additional circuitry. The poor Q-factor of a component switched into an impedance matching network results in a high energy loss for the impedance matching network, which results in a degraded PAE.

Since the sweetspots of the PWL 5 and PWL 7 match are not well aligned, it is not possible to rotate the load impedance arrow to an optimum angle for both power levels. However, this deficiency can be solved by using more than a single load switch such that multiple components are switched at a time. In general, having multiple load switches in an output impedance matching network is not a desirable solution because any additional switches will increase the energy loss, which reduces PAE. Further still, multiple load switches and associated components add financial cost to manufacturing a mobile terminal circuit board.

As a result of these deficiencies, there is a need for a load switch circuit to optimize PAE through aligning the load impedance arrows for the sweetspots of various power levels, while minimizing the energy losses due to the output impedance matching network of a load switch circuit.

SUMMARY OF THE DISCLOSURE

The present disclosure provides a load switch circuit having aligned sweetspots for operation at various power levels. Moreover, switches in the load switch circuit are dual function in that the switches serve as impedance matching network selectors as well as transmit and receive switches. Therefore, no additional energy loss is introduced by the use of the switches.

In general, the present disclosure describes a load switch circuit having a power amplifier for amplifying a radio frequency signal to provide an amplified radio frequency signal having a first power level and a second power level. A first impedance matching network section is in electrical communication with the power amplifier to receive the amplified radio frequency signal. A second impedance matching network section is in electrical communication with the first impedance matching network section to receive the amplified radio frequency signal and includes an output for the amplified radio frequency signal. The output of the second impedance matching network section is selectively placed in electrical communication with a load network by way of a first switch during transmission of the amplified radio frequency signal at the first power level. A third impedance matching network section is also in electrical communication with the first impedance matching network section to receive the amplified radio frequency signal. The third impedance matching network section has an output for the amplified radio frequency signal that is selectively placed in electrical communication with the load network by way of a second switch during transmissions of the amplified radio frequency signal at the second power level.

A switch control system is coupled to the first switch and the second switch and is adapted to selectively place the second impedance matching network section in electrical communication with the load network during transmission of the amplified radio signal at the first power level by opening the second switch and closing the first switch. The switch control system is also adapted to selectively place the third impedance matching network section in electrical communication with the load network during transmission of the amplified radio signal at the second power level by opening the first switch and closing the second switch.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 is a table showing power level (PWL) numbers for the GSM 900 MHz band with corresponding power output levels delivered to a GSM mobile terminal's antenna.

DETAILED DESCRIPTION OF THE PREFERRED EMBODIMENTS

The embodiments set forth below represent the necessary information to enable those skilled in the art to practice embodiments of the disclosure and illustrate the best mode of practicing the principles of the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 2:
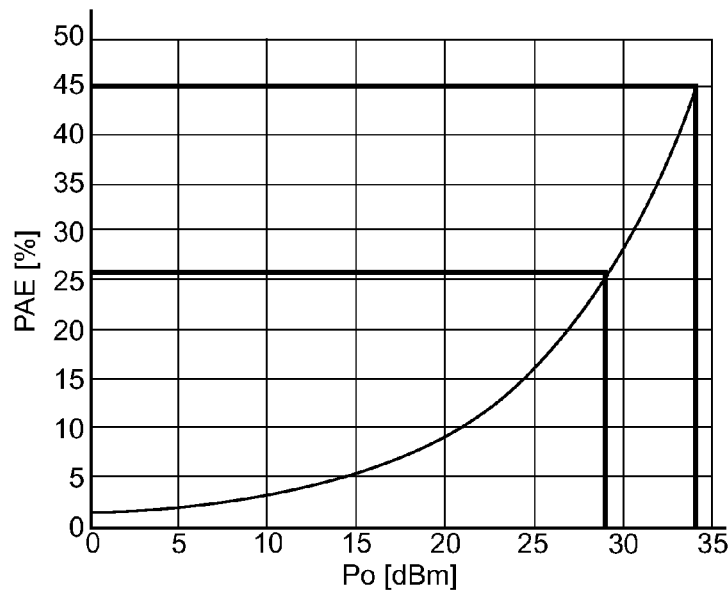
FIG. 2 is a graph that illustrates the relationship between PAE and $P_o$.
Figure 3:
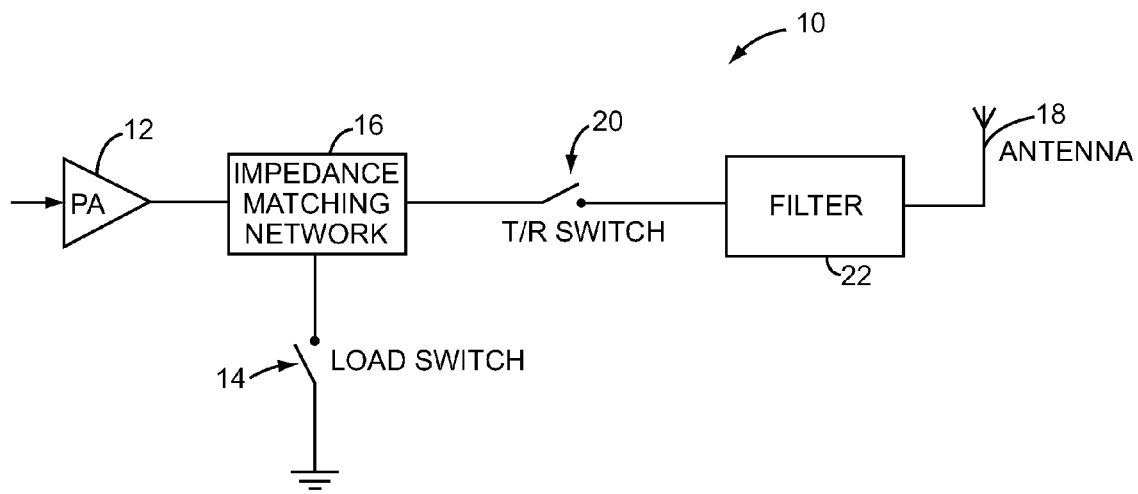
FIG. 3 is a schematic diagram of a prior art mobile terminal output stage.
Figure 4:
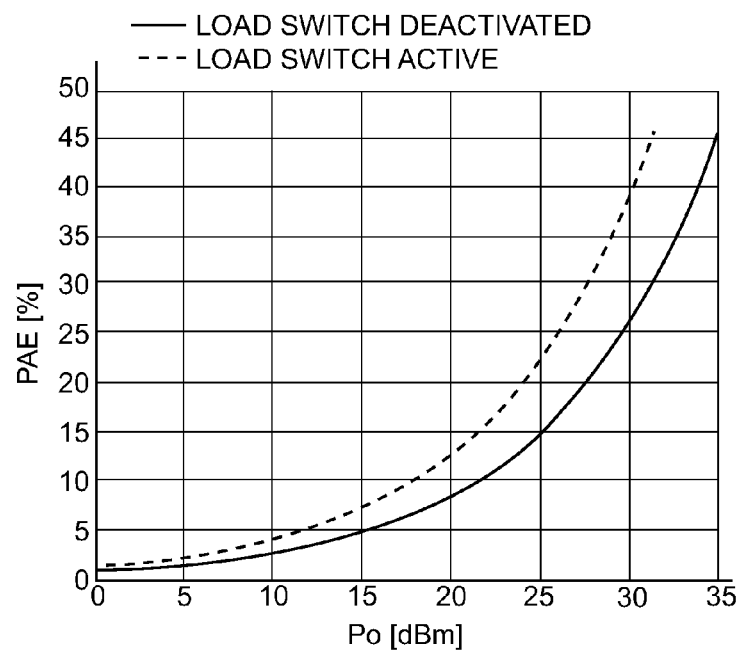
FIG. 4 is a graph that depicts an improvement in PAE by activation of a load switch.
Figure 5:
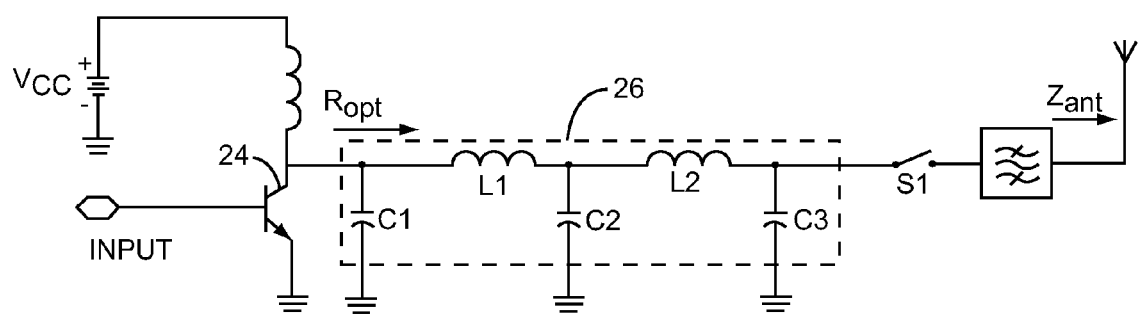
FIG. 5 is a schematic diagram of a typical PA that was designed in accordance with the classical power amplifier textbook theory.
Figure 6A:
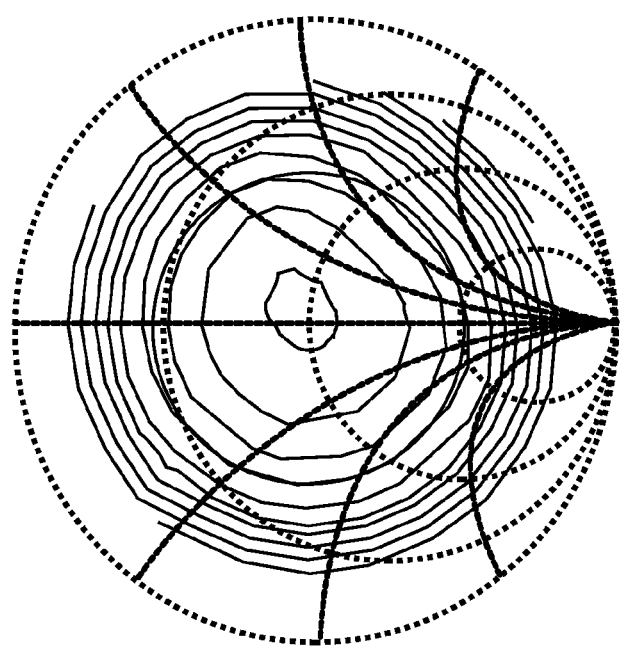
FIG. 6A is a Smith Chart with a series of overlaying load-pull contours depicting power consumption for a typical PA.
Figure 6B:
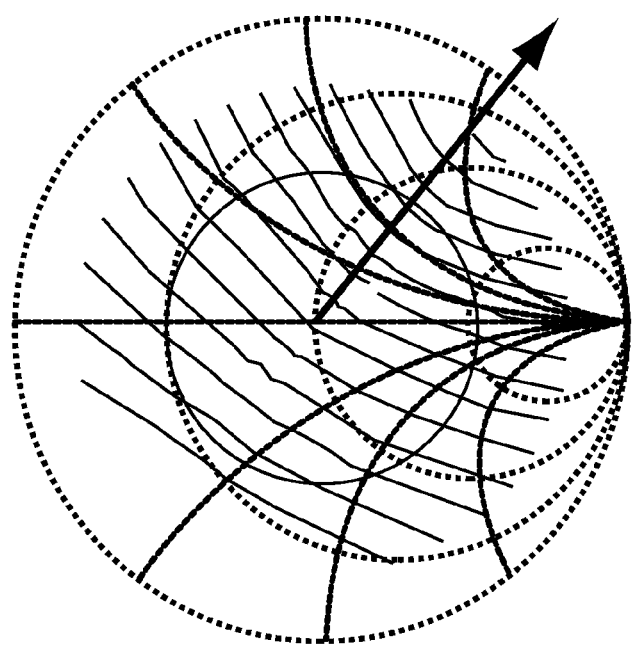
FIG. 6B is a Smith Chart with a series of overlaying load-pull contours depicting output current contours having a sweetspot denoted by a load impedance arrow.
Figure 7A:
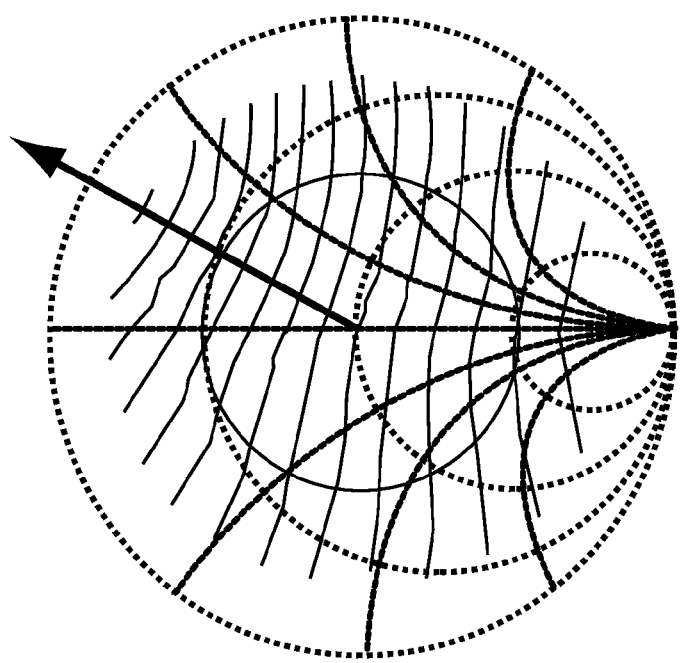
FIG. 7A is a Smith Chart with a series of overlaying load-pull contours for the output current of a PA operating at PWL 5.
Figure 7B:
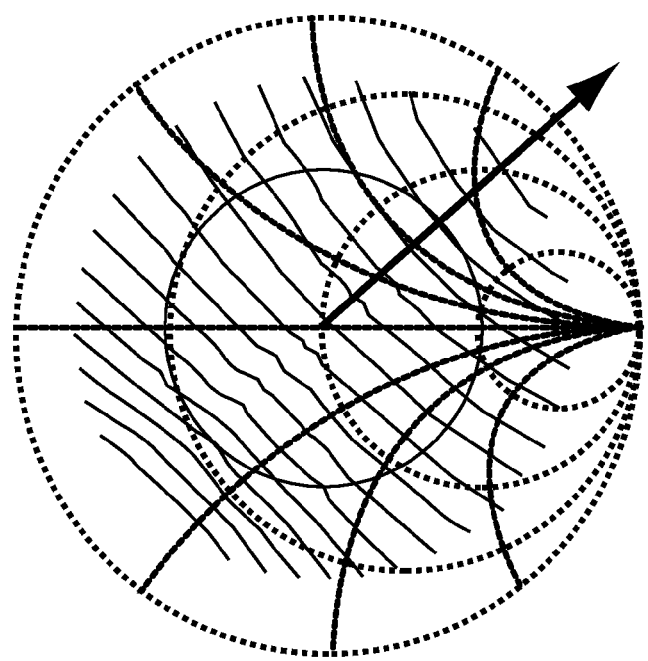
FIG. 7B is a Smith Chart with a series of overlaying load-pull contours for the output current of a PA operating at PWL 7.
Figure 8:
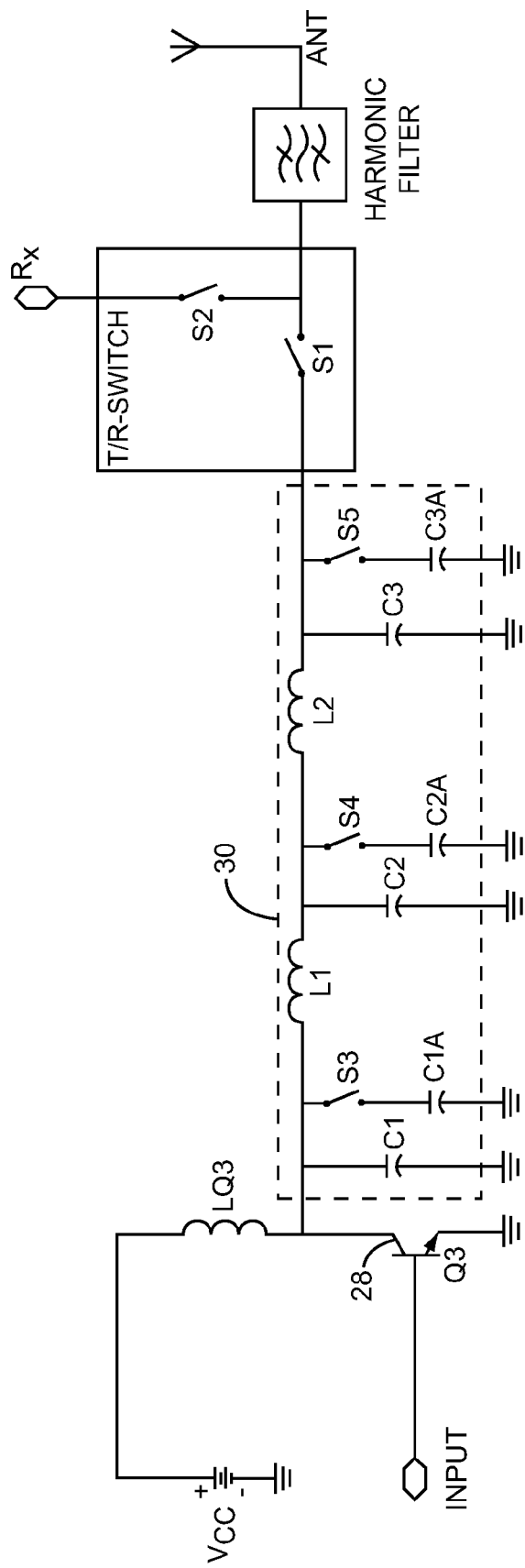
FIG. 8 is a schematic diagram of a typical prior art PA having an output impedance matching network with a plurality of load switches.
Figure 9:
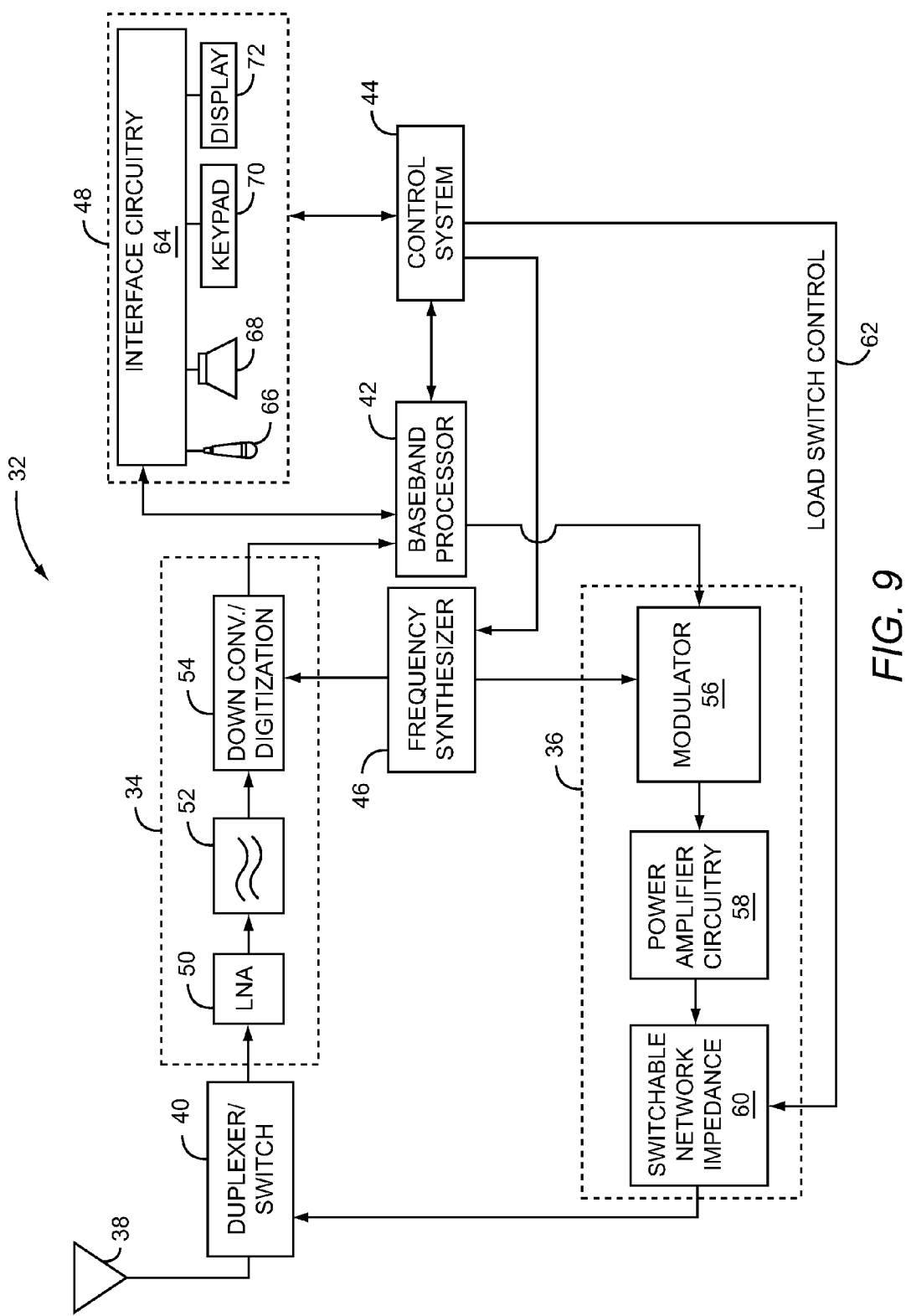
FIG. 9 is a schematic representation of a mobile terminal configured to an embodiment of the present disclosure.

Turning now to FIG. 9, a preferred embodiment of the present disclosure is incorporated in a mobile terminal 32, such as a mobile telephone, a personal digital assistant, or the like. The basic architecture of the mobile terminal 32 and may include a receiver front end 34, a radio frequency transmitter section 36, an antenna 38, a duplexer or switch 40, a baseband processor 42, a control system 44, a frequency synthesizer 46, and an interface 48. The receiver front end 36 receives information bearing radio frequency signals from one or more remote transmitters provided by a base station. A low noise amplifier 50 amplifies the signal. A filter circuit 52 minimizes broadband interference in the received signal, while downconversion and digitization circuitry 54 downconverts the filtered, received signal to an intermediate or baseband frequency signal, which is then digitized into one or more digital streams. The receiver front end 34 typically uses one or more mixing frequencies generated by the frequency synthesizer 46.

The baseband processor 42 processes the digitized received signal to extract the information or data bits conveyed in the received signal. This processing typically comprises demodulation, decoding, and error correction operations. As such, the baseband processor 42 is generally implemented in one or more digital signal processors (DSPs).

On the transmit side, the baseband processor 42 receives digitized data, which may represent voice, data, or control information, from the control system 44, which it encodes for transmission. The encoded data is output to the radio frequency transmitter 36, where it is used by a modulator 56 to modulate a carrier signal that is at a desired transmit frequency. Power amplifier (PA) circuitry 58 amplifies the modulated carrier signal to a level appropriate for transmission from the antenna 38.

The amplified signal is sent to the switch 40 and antenna 38 through a switchable impedance network 60, which is configured to set the overall load impedance for the PA circuitry 58 to optimize values based on the power level being transmitted. Typically, the switch 40 and antenna 38 provide a relatively constant load impedance, which is combined with the impedance of the switchable impedance network 60 to establish an overall load impedance for the PA circuitry 58. A load switch control signal 62 is provided by the control system 44 to select an impedance matching network section, which will vary depending on the power level being transmitted. The structure and operation of impedance matching network sections comprising the switchable impedance network 60 is provided in greater detail below.

A user may interact with the mobile terminal 32 via the interface 48, which may include interface circuitry 64 associated with a microphone 66, a speaker 68, a keypad 70, and a display 72. The interface circuitry 64 typically includes analog-to-digital converters, digital-to-analog converters, amplifiers, and the like. Additionally, it may include a voice encoder/decoder, in which case it may communicate directly with the baseband processor 42.

The microphone 66 will typically convert audio input, such as the user's voice, into an electrical signal, which is then digitized and passed directly or indirectly to the baseband processor 42. Audio information encoded in the received signal is recovered by the baseband processor 42, and converted into an analog signal suitable for driving speaker 68 by the I/O and interface circuitry 64. The keypad 70 and the display 72 enable the user to interact with the mobile terminal 32, input numbers to be dialed, address book information, or the like, as well as monitor call progress information.

Figure 10A:
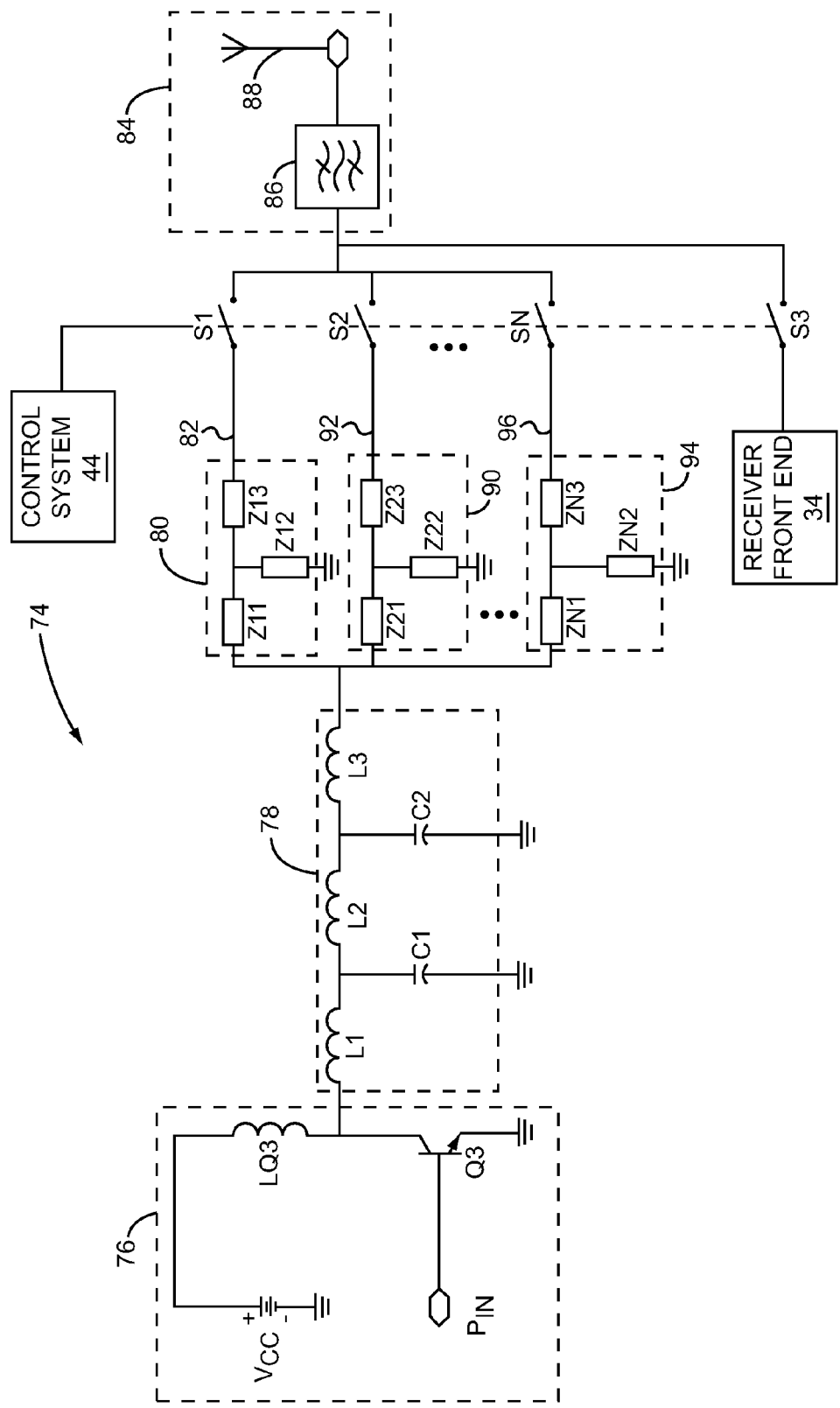
FIG. 10A is a general schematic representation of a load switch circuit according to the present disclosure.

FIG. 10A is a general schematic representation of a load switch circuit 74 according to the present disclosure. Load switch circuit 74 includes a power amplifier 76 for amplifying a radio frequency signal to provide an amplified radio frequency signal having a first power level and at least a second power level. A first impedance matching network section 78 is in electrical communication with the power amplifier 76 to receive the amplified radio frequency signal. A second impedance matching network section 80 is in electrical communication with the first impedance matching network section 78 to receive the amplified radio frequency signal, wherein the second impedance matching 80 network has an output 82 for the amplified radio frequency signal that is selectively placed in electrical communication with a load network 84 via a switch S1 during transmission of the amplified radio frequency signal at the first power level. The load network 84 typically includes a harmonic filter 86 and an antenna 88.

A third impedance matching network section 90 is in electrical communication with the first impedance matching network section 78 to receive the amplified radio frequency signal, wherein the third impedance matching network section 90 has an output 92 for the amplified radio frequency signal that is selectively placed in electrical communication with the load network 84 via a switch S2 during transmissions of the amplified radio frequency signal at the second power level. Additional impedance matching network sections, such as an Nth impedance matching network section 94 is in electrical communication with the first impedance matching network section 78, wherein the Nth impedance matching network section 94 has an output 96 that is selectively placed in electrical communication with the load network 84 via a switch SN during transmissions of the amplified radio frequency signal at an Nth power level. It is important to note that the individual closure of any one of the switches S1, S2 and SN creates a series path for the amplified radio frequency signal through the first impedance network section 78, and the corresponding one of the impedance matching network sections 80, 90, or 94. In this way, the switches S1, S2 and SN not only function as impedance matching network selectors, but also function as transmit and receive switches. Due to their dual function, the switches S1, S2 and SN do not introduce addition energy losses relative to conventional switching circuitry used to switch impedance matching elements in conventional load switch circuits.

The control system 44 provides the load switch control signal 62 (FIG. 9) for opening and closing the switches S1, S2, S3 and SN. In a receive mode, the control system 44 opens the switches S1, S2, and SN before closing switch S3. While the switch S3 is closed, RF signals received by antenna 88 are conducted to the receiver front end 34.

Figure 10B:
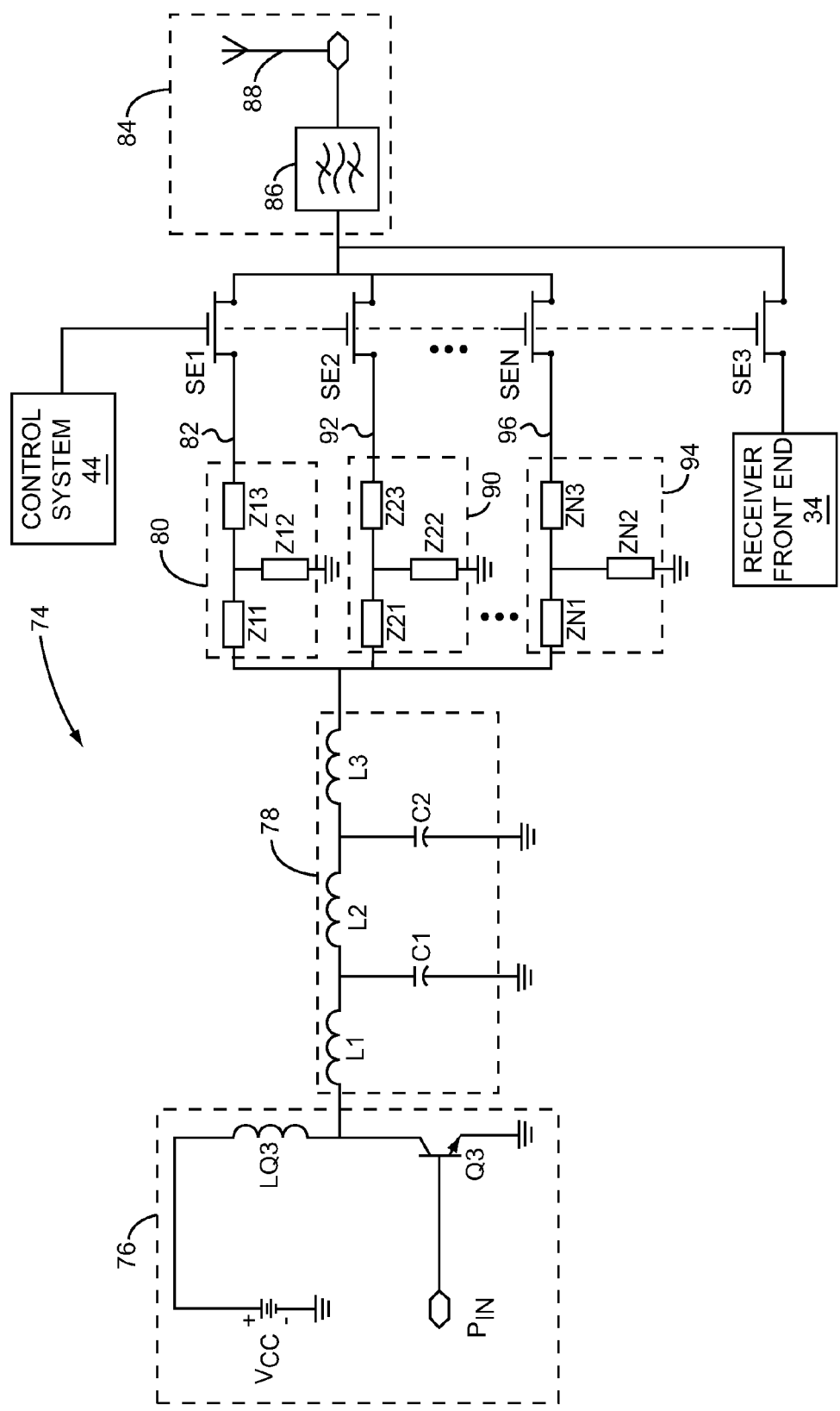
FIG. 10B is a general schematic representation of the load switch circuit of FIG. 10A wherein the switches are depicted as electronic switches.

FIG. 10B is a general schematic representation of the load switch circuit of FIG. 10A wherein the switches S1, S2, S3 and SN are depicted as electronic switches SE1, SE2, SE3 and SEN. The electronic switches SE1, SE2, SE3 and SEN may be implemented as transistor switches as depicted in FIG. 10B. In particular, the transistor switches may each be a field effect transistor (FET) or other transistor type that is useable to switch radio frequency signals. The gates of the FET transistors making up switches SE1, SE2, SE3 and SEN are each driven by the switch control signal 62 that is provided by the control system 44. The switch control signal 62 turns the FET transistors either on or off. For example, when the FET making up the switch SE1 is turned on, the output 82 of the second impedance matching network section 80 is connected to the input of the harmonic filter 86. When the FET making up the switch SE1 is turned off, the FET will provide a high impedance or open-circuit condition that disconnects the second impedance matching network section 80 from the input of the harmonic filter 86. The FETs making up SE2 and SEN work in a similar fashion. The FET making up switch SE3 will provide a high impedance or open circuit condition when the switch SE3 is turned off. In this way, an amplified RF signal meant for transmission from the antenna 88 will be impeded from being received by the receiver front end 34. However, when the switch SE3 is turned on a low impedance path for RF signals received by the antenna 88 is provided between the receiver front end 34 and the receiver front end 34.

Figure 11:
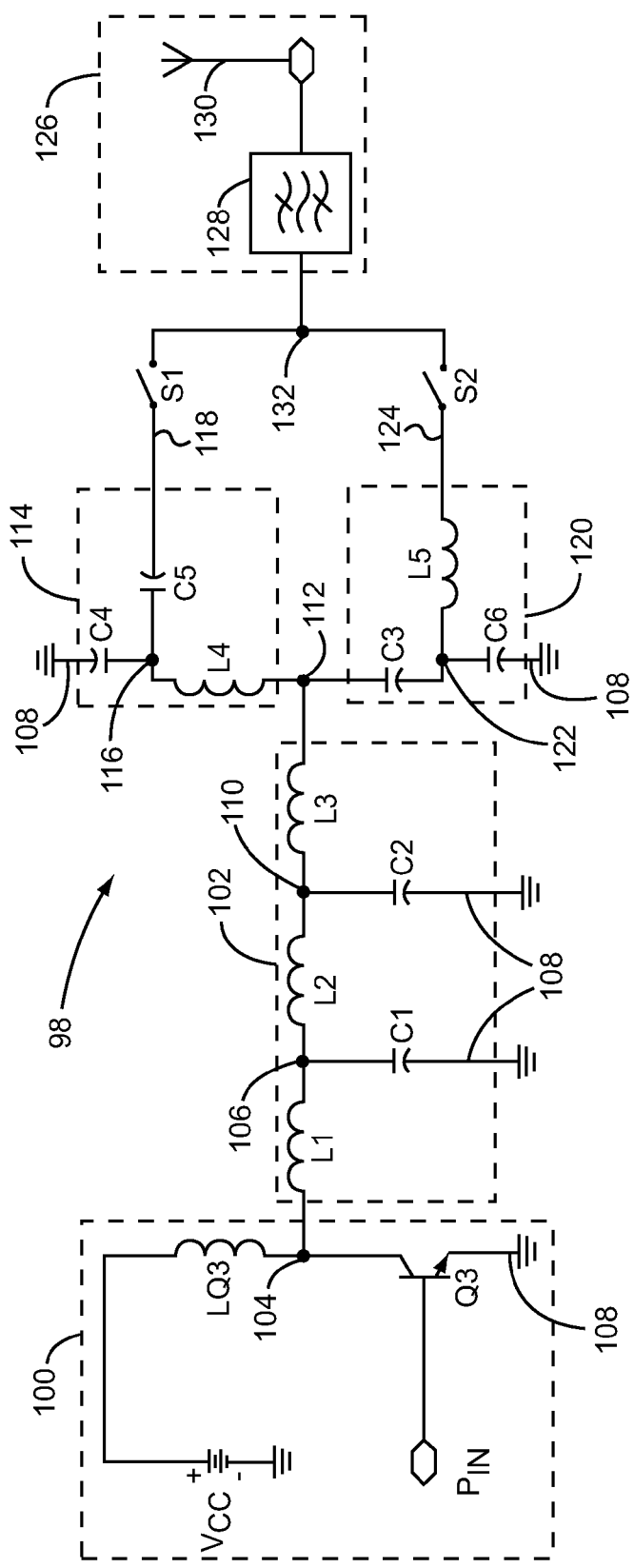
FIG. 11 is a detailed schematic representation of an embodiment of a load switch circuit according to the present disclosure.

FIG. 11 is a detailed schematic of an embodiment of a load switch circuit 98 according to the present disclosure. Load switch circuit 98 is useable to increase the PAE of a power amplifier (PA) 100 that is operable at ECTEL power levels PWL 5 and PWL 7. A first impedance matching network section 102 comprises a traditional L-C-L-C-L circuit with inductive components L1, L2 and L3, and capacitive components C1 and C2. A first terminal of L1 is coupled to an output 104 of the PA 100 in order to receive an amplified radio frequency signal from the PA 100. A second terminal of L1 is coupled to a first terminal of L2 and a first terminal of C1 at a common node 106. A second terminal of C1 is coupled to a ground node 108. A second terminal of L2 is coupled to a first terminal of L3 and a first terminal of C2 at a common node 110. A second terminal of C2 is coupled to the ground node 108. A second terminal of L3 is an output node 112 for the first impedance matching network section 102.

A second impedance matching network section 114 has an inductor L4, and capacitors C4 and C5. A first terminal of L4 is coupled to the second terminal of L3 at the output node 112. A second terminal L4 is coupled to a first terminal of C4 and a first terminal of C5 at a common node 116. A second terminal of C4 is coupled to the ground node 108. A second terminal of C5 is an output node 118 for the second impedance matching network section 114.

A third impedance network section 120 has capacitors C3 and C6, and an inductor L5. A first terminal of C3 is coupled to the second terminal of L3, and the first terminal of L4 at the output node 112. A second terminal of C3 is coupled to a first terminal of C6 and a first terminal of L5 at a common node 122. A second terminal of C6 is coupled to the ground node 108. A second terminal of L5 is an output node 124 for the third impedance network section 120.

Figure 12:
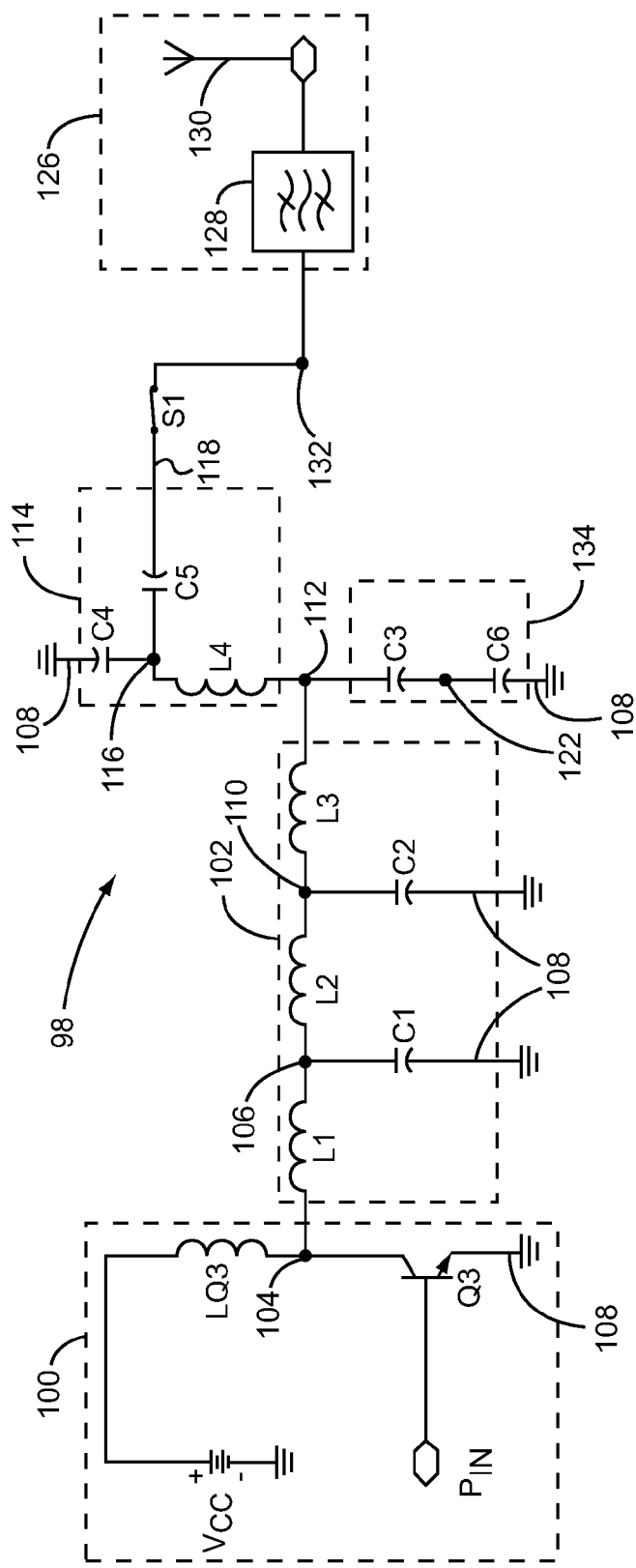
FIG. 12 is a schematic representing the operation of the load switch circuit at ECTEL power level PWL 7.

An load network 126 is comprised of a harmonic filter 128 and an antenna 130. An output terminal of the harmonic filter 128 is coupled to an input of the antenna 130. A switch S1 for selectively coupling the second impedance matching network section 114 has a first terminal that is coupled to the output node 118. A second terminal of switch S1 is coupled to an input terminal of the harmonic filter 128 at a common node 132. A switch S2 for selectively coupling the third impedance matching network section 120 has a first terminal that is coupled to the output node 124. A second terminal of switch S2 is coupled to the input terminal of the harmonic filter 128 at the common node 132. As shown in FIG. 11, the switches S1 and S2 are opened such that the second impedance matching network section 114 and the third impedance network section 120 are decoupled from the load network 126. In this way, radio frequency signals impinging on antenna 130 may be received by the receiver front end 34 (FIGS. 9, 10A and 10B). FIG. 12 is a schematic representing the operation of the load switch circuit 98 at ECTEL power level PWL 7. While operating at the PWL 7 power level, the switch S1 is closed and the switch S2 is left open. As a result of the switch S2 being open, the inductor L5 does not present an impedance matching effect. Thus, L5 is not shown as part of an equivalent circuit section 134. However, as shown in the equivalent circuit section 134, the capacitors C3 and C5 are placed in series.

Figure 13:
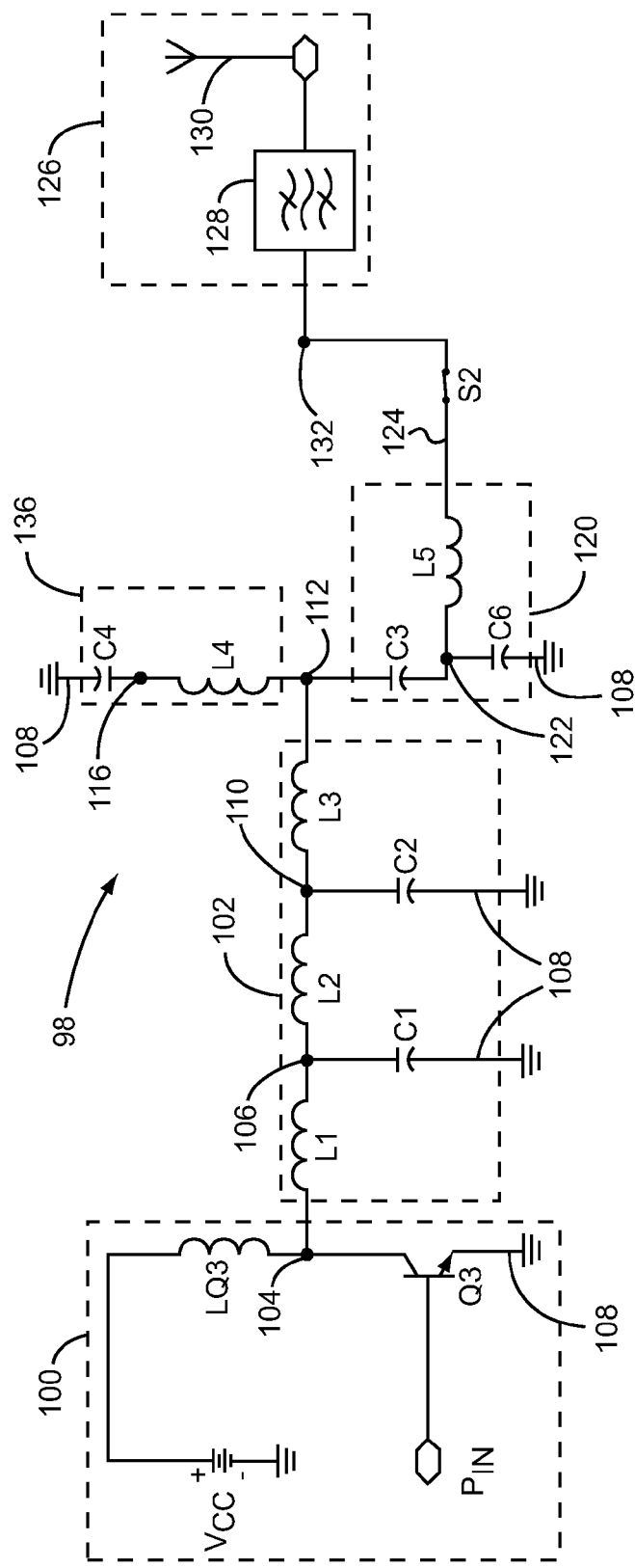
FIG. 13 is a schematic representing the operation of the load switch circuit at ECTEL power level PWL 5.

Capacitors C3 and C6 function as a total capacitive reactance incorporated in the matching network. FIG. 13 is a schematic representing the operation of the load switch circuit 98 at ECTEL power level PWL 5. During operation of load switch circuit 98 at the PWL 5 power level, the switch S2 is closed and the switch S1 is left open. As a result of the switch S1 being open, the capacitor C5 does not present an impedance matching effect. Thus, C5 is not shown as part of an equivalent circuit section 136, which places inductor L4 in series with capacitor C4. The inductor L4 and the capacitor C4 may be selected such that a resonant frequency for the equivalent circuit section 136 is above the carrier frequency of a radio frequency being amplified by PA 100. In this way, the equivalent circuit section 136 behaves as a capacitive reactance at the carrier frequency of radio frequency being passed to the load network 126.

Turning back to FIG. 11, it is preferred that component values for the inductors L1-L5, and C1-C6 be selected such that a collector impedance of PA 100 in the approximate range of 7-7.5 Ohms is matched by the first and second impedance matching networks sections 102 and 114 for PWL 7 operation. Likewise, it is preferred that component values for the inductors L1-L5, and C1-C6 be selected such that a collector impedance of approximately 2.5 Ohms is matched by the first and third impedance network sections 102 and 120 for PWL 5 operation. Additionally, a sweetspot for operating the PA 100 at the PWL 5 power level may be rotated on a Smith Chart to an optimum angle via C5 and L5 without affecting an optimum impedance match for the PWL 7 power level. Therefore, an advantage of the load switch circuit 98 is that the alignment of the sweetspots for operation at both the PWL 5 and PWL 7 power levels is realizable.

Figure 14A:
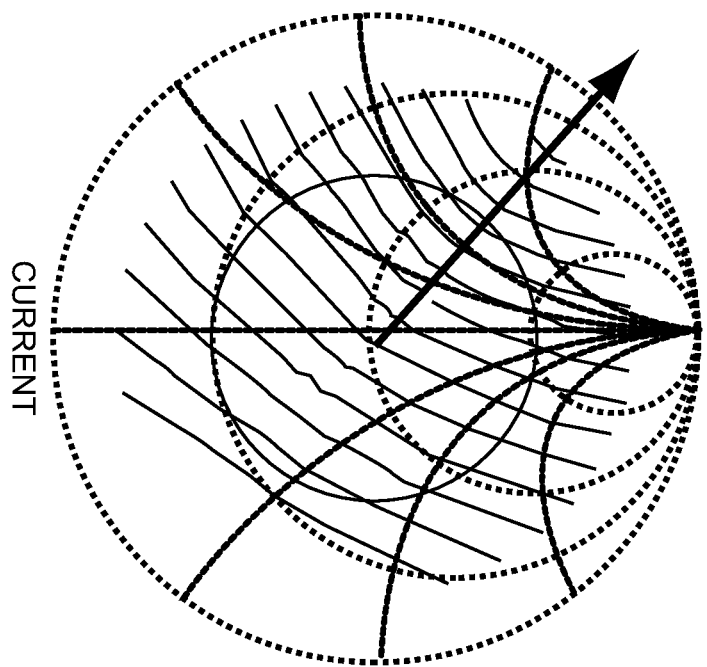
FIG. 14A depicts load-pull contours for a PA operating at PWL 5 in a module that implements a load switch circuit according to the present disclosure.
Figure 14B:
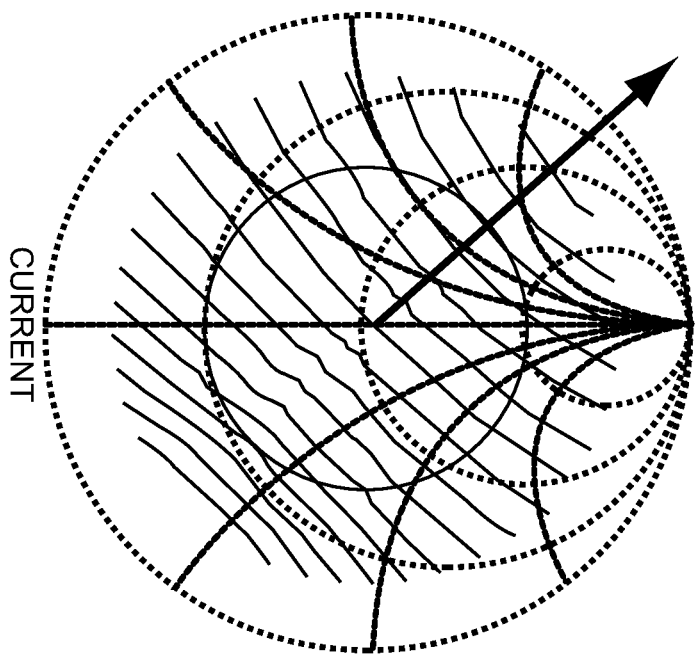
FIG. 14B depicts load-pull contours for a PA operating at PWL 7 in a module that implements a load switch circuit according to the present disclosure.

FIGS. 14A and 14B depict load-pull contours for a PA in a module that implements the load switch circuit 98 (FIGS. 12, 13 and 14). The load-pull contours of FIG. 14A are for PA 100 operated at the PWL 5 power level. The load-pull contours of FIG. 14B are for PA 100 operated at the PWL 7 power level. Notice that the sweetspots for both the PWL 5 and PWL 7 power levels are in the upper right quadrants of a series of PA output current contours shown overlaying a Smith chart for both FIGS. 14A and 14B. A load impedance for load network 84 is represented by load impedance arrows that extend from the centers of the Smith Charts. As a result, of the method and system of the present disclosure, the load impedance arrows are rotated and aligned into the regions where the PA 100 has minimum current draw in both power levels PWL 5 and PWL 7.

Those skilled in the art will recognize improvements and modifications to the preferred embodiments of the present disclosure. For example, the electronic switches SE1, SE2, SE3, and SEN in FIG. 10B may also be implemented using a diode with a diode switching network. The diode may be of the positive-intrinsic-negative (PIN) diode type or other type that is useable to switch radio frequency signals. All such improvements and modifications are considered within the scope of the concepts disclosed herein and the claims that follow.

What is claimed is:
1. A circuit comprising:
a) a power amplifier adapted to amplify a radio frequency signal and provide an amplified radio frequency signal having at least one of a first power level and a second power level;
b) a first impedance matching network section coupled to the power amplifier to receive the amplified radio frequency signal;
c) a first switch;
d) a second switch;
e) a second impedance matching network section comprising a plurality of passive components coupled between the first impedance matching network section and the first switch and adapted to receive the amplified radio frequency signal, wherein the second impedance matching network section has an output for the amplified radio frequency signal that is selectively placed in electrical communication with a load network during transmission of the amplified radio frequency signal at the first power level;

f) a third impedance matching network section comprising a plurality of passive components coupled between the first impedance matching network section and the second switch and adapted to receive the amplified radio frequency signal, wherein the third impedance matching network has an output for the amplified radio frequency signal that is selectively placed in electrical communication with the load network during transmission of the amplified radio frequency signal at the second power level, and further wherein the plurality of passive components of the second impedance matching network section and the third impedance matching network section are configured such that the angles of the complex reflection coefficient for the second impedance matching network section and the third impedance matching network section are about equal and such that current consumption for the power amplifier at the first power level and the second power level is minimized; and g) a switch control system coupled to the first switch and second switch and adapted to selectively place the second impedance matching network section in electrical communication with the load network during transmission of the amplified radio frequency signal at the first power level and selectively place the third impedance matching network section in electrical communication with the load network during transmission of the amplified radio frequency signal at the second power level.

2. The circuit of claim 1, further comprising a third switch coupled between a receive circuitry and the load network, and wherein the switch control system is further adapted to actuate a receive switch to couple the load network to the receive circuitry during a receive mode.

3. The circuit of claim 2 wherein the first switch, the second switch and the third switch form a transmit/receive switch.

4. The circuit of claim 1 further comprising a fourth switch, and a fourth impedance matching network section coupled between the first impedance matching network section and the fourth switch and adapted to receive the amplified radio frequency signal; wherein the switch control system is further adapted to actuate the fourth switch to couple the fourth impedance matching network section to the load network during the transmission of the amplified radio frequency signal at a third power level.

5. The circuit of claim 1 wherein the load network is an antenna network comprising an antenna and a harmonic filter.

6. The circuit of claim 1, wherein the first switch is an electronic switch between the output of the second impedance matching network section and the load network, wherein the electronic switch is responsive to a load switch control signal to selectively couple the load network to the output of the second impedance matching network section.

7. The circuit of claim 6, wherein the electronic switch is a transistor adapted to switch a radio frequency signal amplified by the power amplifier.

8. The circuit of claim 7, wherein the electronic switch is a field effect transistor (FET).

9. The circuit of claim 1, wherein the second switch is an electronic switch between the output of the third impedance matching network section and the load network, wherein the electronic switch is responsive to a load switch control signal to selectively couple the load network to the output of the third impedance matching network section.

10. The circuit of claim 9, wherein the electronic switch is a transistor adapted to switch a radio frequency signal amplified by the power amplifier.

11. The circuit of claim 10, wherein the electronic switch is a field effect transistor (FET).

12. A mobile terminal comprising:
a) a power amplifier adapted to amplify a radio frequency signal and provide an amplified radio frequency signal having at least one of a first power level and a second power level;
b) a first impedance matching network section coupled to the power amplifier to receive the amplified radio frequency signal;
c) a first switch;
d) a second switch;
e) a second impedance matching network section comprising a plurality of passive components coupled between the first impedance matching network section and the first switch and adapted to receive the amplified radio frequency signal, wherein the second impedance matching network has an output for the amplified radio frequency signal that is selectively placed in electrical communication with a load network during transmission of the amplified radio frequency signal at the first power level;
f) a third impedance matching network section comprising a plurality of passive components coupled between the first impedance matching network section and the second switch and adapted to receive the amplified radio frequency signal, wherein the third impedance matching network has an output for the amplified radio frequency signal that is selectively placed in electrical communication with the load network during transmission of the amplified radio frequency signal at the second power level, and further wherein the plurality of passive components of the second impedance matching network section and the third impedance matching network section are configured such that the angles of the complex reflection coefficient for the second impedance matching network section and the third impedance matching network section are about equal and such that current consumption for the power amplifier at the first power level and the second power level is minimized; and
g) a switch control system coupled to the first switch and the second switch and adapted to selectively place the second impedance matching network section in electrical communication with the load network during transmission of the amplified radio frequency signal at the first power level and selectively place the third impedance matching network section in electrical communication with the load network during transmission of the amplified radio frequency signal at the second power level; and
h) an interface in communication with the switch control system, wherein the interface is adapted to enable a user to interact with the switch control system.

13. The mobile terminal of claim 12, further comprising a third switch coupled between a receive circuitry and the load network, and wherein the switch control system is further adapted to actuate a receive switch to couple the load network to the receive circuitry during a receive mode.

14. The mobile terminal of claim 13 wherein the first switch, the second switch and the third switch form a transmit/receive switch.

15. The mobile terminal of claim 12, further comprising a fourth switch, and a fourth impedance matching network section coupled between the first impedance matching network section and the fourth switch and adapted to receive the amplified radio frequency signal, wherein the switch control system is further adapted to actuate the fourth switch to couple the fourth impedance matching network section to the load network during the transmission of the amplified radio frequency signal at a third power level.

16. The mobile terminal of claim 12 wherein the load network is an antenna network comprising an antenna and a harmonic filter.

17. The mobile terminal of claim 12, wherein the first switch is an electronic switch between the output of the second impedance matching network section and the load network, wherein the electronic switch is responsive to a load switch control signal provided by the switch control system to selectively couple the load network to the output of the second impedance matching network section.

18. The mobile terminal of claim 17, wherein the electronic switch is a transistor configured to selectively couple the load network to the output of the second impedance matching network section.

19. The mobile terminal of claim 18, wherein the electronic switch is a field effect transistor (FET) adapted to switch the amplified radio frequency signal.

20. The mobile terminal of claim 12, wherein the second switch is an electronic switch between the output of the third impedance matching network section and the load network, wherein the electronic switch is responsive to a load switch control signal provided by the switch control system to selectively couple the load network to the output of the third impedance matching network section.

21. The mobile terminal of claim 20, wherein the electronic switch is a transistor.

22. The mobile terminal of claim 21, wherein the electronic switch is a field effect transistor (FET) adapted to switch the amplified radio frequency signal amplified by the power amplifier.

23. A circuit comprising:
a) a power amplifier adapted to amplify a radio frequency signal and provide an amplified radio frequency signal having at least one of a first power level and a second power level;
b) a first impedance matching network section coupled to the power amplifier to receive the amplified radio frequency signal;
c) a first switch;
d) a second switch;
e) a second impedance matching network section coupled between the first impedance matching network section and the first switch and adapted to receive the amplified radio frequency signal, wherein the second impedance matching network section has an output for the amplified radio frequency signal that is selectively placed in electrical communication with a load network during transmission of the amplified radio frequency signal at the first power level such that only one switch exists in the signal path of the amplified radio frequency signal;
f) a third impedance matching network section coupled between the first impedance matching network section and the second switch and adapted to receive the amplified radio frequency signal, wherein the third impedance matching network section has an output for the amplified radio frequency signal that is selectively placed in electrical communication with the load network during transmission of the amplified radio frequency signal at the second power level such that only one switch exists in the signal path of the amplified radio frequency signal; and
g) a switch control system coupled to the first switch and the second switch and adapted to selectively place the second impedance matching network section in electrical communication with the load network during transmission of the amplified radio frequency signal at the first power level and selectively place the third impedance matching network section in electrical communication with the load network during transmission of the amplified radio frequency signal at the second power level.

* * * * *